US010937962B2

(12) United States Patent
Kim et al.

(10) Patent No.: US 10,937,962 B2
(45) Date of Patent: Mar. 2, 2021

(54) METHOD FOR MANUFACTURING CONDUCTIVE POLYMER THIN FILM HAVING SEMICONDUCTOR CHARACTERISTIC AND THIN-FILM TRANSISTOR COMPRISING CONDUCTIVE POLYMER THIN FILM HAVING SEMICONDUCTOR CHARACTERISTIC

(71) Applicant: CHUNGANG UNIVERSITY INDUSTRY ACADEMIC COOPERATION FOUNDATION, Seoul (KR)

(72) Inventors: Felix Sunjoo Kim, Seoul (KR); Dong Uk Kim, Seoul (KR)

(73) Assignee: CHUNGANG UNIVERSITY INDUSTRY ACADEMIC COOPERATION FOUNDATION, Seoul (KR)

(*) Notice: Subject to any disclaimer, the term of this patent is extended or adjusted under 35 U.S.C. 154(b) by 0 days.

(21) Appl. No.: 16/489,730

(22) PCT Filed: Aug. 17, 2017

(86) PCT No.: PCT/KR2017/008935
§ 371 (c)(1),
(2) Date: Aug. 29, 2019

(87) PCT Pub. No.: WO2018/235990
PCT Pub. Date: Dec. 27, 2018

(65) Prior Publication Data
US 2020/0212305 A1 Jul. 2, 2020

(30) Foreign Application Priority Data
Jun. 22, 2017 (KR) .................. 10-2017-0079330

(51) Int. Cl.
*H01L 51/00* (2006.01)
*H01L 51/05* (2006.01)
*H01L 51/10* (2006.01)

(52) U.S. Cl.
CPC ...... *H01L 51/0037* (2013.01); *H01L 51/0001* (2013.01); *H01L 51/0003* (2013.01);
(Continued)

(58) Field of Classification Search
CPC .............. H01L 51/0037; H01L 51/105; H01L 51/0035; H01L 51/0001; H01L 51/0558
See application file for complete search history.

(56) References Cited

U.S. PATENT DOCUMENTS

2002/0093283 A1* 7/2002 Seo ............... H01L 51/5012
313/504
2003/0134487 A1* 7/2003 Breen ............. H01L 51/0024
438/455

(Continued)

FOREIGN PATENT DOCUMENTS

JP 3359794 12/2002
JP 2009-170906 7/2009
(Continued)

OTHER PUBLICATIONS

International Search Report and Written Opinion issued in Corresponding International Patent Application No. PCT/KR2017/008935, dated Mar. 23, 2018.

*Primary Examiner* — Michele Fan
(74) *Attorney, Agent, or Firm* — Norton Rose Fulbright US LLP

(57) ABSTRACT

The present invention relates to a method for manufacturing a conductive polymer thin-film having a semiconductor property and to a thin-film transistor including a conductive polymer thin-film having a semiconductor property. The method for manufacturing a conductive polymer thin-film
(Continued)

having a semiconductor property includes exposing at least a portion of a conductive polymer thin-film to a surface treatment agent to reduce a charge density of the exposed at least a portion of the conductive polymer thin-film.

3 Claims, 3 Drawing Sheets

(52) U.S. Cl.
CPC ...... *H01L 51/0035* (2013.01); *H01L 51/0545* (2013.01); *H01L 51/105* (2013.01); *H01L 51/0558* (2013.01)

(56) References Cited

U.S. PATENT DOCUMENTS

| | | | | |
|---|---|---|---|---|
| 2004/0262601 | A1* | 12/2004 | Okuzaki | H01L 51/055 257/40 |
| 2009/0117268 | A1* | 5/2009 | Lewis | C08G 61/125 427/205 |
| 2013/0049118 | A1* | 2/2013 | Katsuhara | H01L 51/105 257/347 |
| 2015/0044804 | A1* | 2/2015 | Barr | B82Y 10/00 438/46 |
| 2016/0126020 | A1 | 5/2016 | Snaith et al. | |

FOREIGN PATENT DOCUMENTS

| | | |
|---|---|---|
| JP | 5157079 | 3/2013 |
| KR | 10-0845506 | 5/2015 |
| KR | 10-1522400 | 5/2015 |

\* cited by examiner

METHOD FOR MANUFACTURING CONDUCTIVE POLYMER THIN FILM HAVING SEMICONDUCTOR CHARACTERISTIC AND THIN-FILM TRANSISTOR COMPRISING CONDUCTIVE POLYMER THIN FILM HAVING SEMICONDUCTOR CHARACTERISTIC

CROSS-REFERENCE TO RELATED APPLICATIONS

This application is a national phase under 35 U.S.C. § 371 of International Application No. PCT/KR2017/008935, filed Aug. 17, 2017, which claims the benefit of Korean Patent Application Serial No. 10-2017-0079330, filed Jun. 22, 2017. The contents of the referenced patent applications are incorporated into the present application by reference.

FIELD

The present disclosure relates to a conductive polymer thin-film with semiconductor properties. More specifically, the present disclosure relates to a method for manufacturing a conductive polymer thin-film having a semiconductor property and to a thin-film transistor including a conductive polymer thin-film having a semiconductor property.

DESCRIPTION OF RELATED ART

A thin-film transistor (TFT) refers to a transistor using a thin-film and is widely used in a liquid crystal display (LCD), an organic light emitting diode (OLED) to act as an electrical switch and to implement precise color rendering. At least three of thin-film transistors are needed to precisely implement color in one pixel in a display such as LCDs and OLEDs. A thin-film transistor which is commonly used in a display circuit includes a gate line made of metal that can control on and off by controlling charge accumulation, and a date line divided into a gate insulation layer insulating a gate from other layers, a semiconductor layer as a channel, and drain and source electrodes. Multiple elements may be driven using orthogonally-extending gate lines and data lines.

However, such a thin-film transistor has a disadvantage in that light loss occurs in a light alignment process due to an opaqueness of a semiconductor and metal electrode respectively used in a driving transistor and an electrode of the display circuit. In particular, unlike the OLED in which a light source exists in a panel, in the LCD, the light source is present behind the panel and thus loss of light is more severe in a process of aligning the light due to presence of additional layers therebetween.

In order to solve this problem, for the thin-film transistor used in the LCD, a portion of the thin-film transistor that reflects the light back downwards, and a gate line and a data line connecting elements to each other are smaller in width thereof in order than the light loss is minimized. This approach may be insufficient in terms of minimization of the light loss. Thus, there is a need for further research and development on a thin-film transistor that may minimize the loss of light and exhibit high performance.

DISCLOSURE

Technical Purposes

One purpose in accordance with the present disclosure is to provide a method for fabricating a transparent electrically conductive polymer thin-film with semiconductor properties.

Another purpose in accordance with the present disclosure is to provide a thin-film transistor that includes a transparent conductive polymer thin-film with semiconductor properties.

Technical Solutions

In a first aspect, the present disclosure proposes a method for manufacturing a conductive polymer thin-film having a semiconductor property, the method comprising: exposing at least a portion of a conductive polymer thin-film to a surface treatment agent to reduce a charge density of the exposed at least a portion of the conductive polymer thin-film.

In one implementation of the first aspect, the surface treatment agent includes at least one of a p-type dopant, an n-type dopant, an oxidizing agent, or a reducing agent.

In one implementation of the first aspect, the surface treatment agent includes at least one of tetrakis(dimethylamino)ethylene (TDAE), ethylenediamine (EDA), hydrazine, sodium borohydride ($NaBH_4$), lithium aluminum hydride ($LiAlH_4$), or sodium thiosulfate ($Na_2S_2O_3$).

In one implementation of the first aspect, the conductive polymer includes at least one of poly(3,4-ethylenedioxythiophene) (PEDOT) based polymer, polyaniline (PANT) based polymer, or polydiimide based polymer.

In one implementation of the first aspect, the conductive polymer thin-film is prepared by: applying a conductive polymer dispersion onto a substrate; and drying the conductive polymer dispersion applied on the substrate.

In one implementation of the first aspect, the conductive polymer dispersion may contain additives. The additive may include organic solvents, acids, bases, or surfactants.

In one implementation of the first aspect, the organic solvent may include at least one of ethylene glycol, dimethyl sulfoxide, or methanol. The acid may include at least one of sulfuric acid, methane sulfonic acid, acetic acid, nitric acid, or hydrochloric acid. The surfactant may include a triton-based surfactant.

In a second aspect, the present disclosure proposes a thin-film transistor comprising: a substrate; a gate electrode disposed on the substrate; a gate dielectric layer covering the gate electrode; a conductive polymer thin-film disposed on the gate dielectric layer, wherein a horizontally middle portion of the conductive polymer thin-film is treated with a surface treatment agent to reduce a charge density of the middle portion to exhibit a semiconductor property; and a source electrode and a drain electrode disposed on the conductive polymer thin-film, wherein the source electrode and a drain electrode are spaced from each other and do not overlap the middle portion of the conductive polymer thin-film.

In one implementation of the second aspect, the surface treatment agent includes at least one of a p-type dopant, an n-type dopant, an oxidizing agent, or a reducing agent.

In one implementation of the second aspect, the surface treatment agent includes at least one of tetrakis(dimethylamino)ethylene (TDAE), ethylenediamine (EDA), hydrazine, sodium borohydride ($NaBH_4$), lithium aluminum hydride ($LiAlH_4$), or sodium thiosulfate ($Na_2S_2O_3$).

In a third aspect, the present disclosure proposes a thin-film transistor comprising: a substrate; a gate electrode disposed on the substrate; a gate dielectric layer covering the gate electrode; a conductive polymer thin-film disposed on the gate dielectric layer, wherein the conductive polymer thin-film is treated with a surface treatment agent to reduce a charge density to exhibit a semiconductor property; and a source electrode and a drain electrode disposed on the conductive polymer thin-film, wherein the source electrode and a drain electrode are spaced from each other.

In one implementation of the third aspect, the surface treatment agent includes at least one of a p-type dopant, an n-type dopant, an oxidizing agent, or a reducing agent.

In one implementation of the third aspect, the surface treatment agent includes at least one of tetrakis(dimethylamino)ethylene (TDAE), ethylenediamine (EDA), hydrazine, sodium borohydride ($NaBH_4$), lithium aluminum hydride ($LiAlH_4$), or sodium thiosulfate ($Na_2S_2O_3$).

Technical Effects

According to the method of manufacturing a conductive polymer thin-film having a semiconductor property and to a conductive polymer thin-film having a semiconductor property according to the present disclosure, a transparent conductive polymer thin-film that may exhibit both semiconductor properties and electrically conductive properties may be realized. Further, a thin-film transistor including a conductive polymer having a semiconductor property may be provided. A conductive polymer thin-film having a semiconductor property in accordance with the present disclosure may exhibit both the semiconductor property and the electrically conductive, so that a single conductive polymer thin-film layer in accordance with the present disclosure may act as both of a semiconductor layer and a data electrode layer (data line). Therefore, since the conductive polymer that may act as an electrode may further act as an active layer of the thin-film transistor, this may exclude a conventional energy-intensive stacking process of a metal electrode. Further, a low temperature process that does not damage a plastic substrate may be available. In addition, since the conductive polymer thin-film having the semiconductor property in accordance with the present disclosure is transparent, it is possible to reduce the loss of light in the thin-film transistor including the conductive polymer thin-film. That is, the opacity of the existing thin-film transistor device which acts as a problematic factor against manufacturing a transparent device may be removed using the conductive polymer thin-film in which a doping amount is controlled.

BRIEF DESCRIPTIONS OF DRAWINGS

DETAILED DESCRIPTIONS

Figure 1:
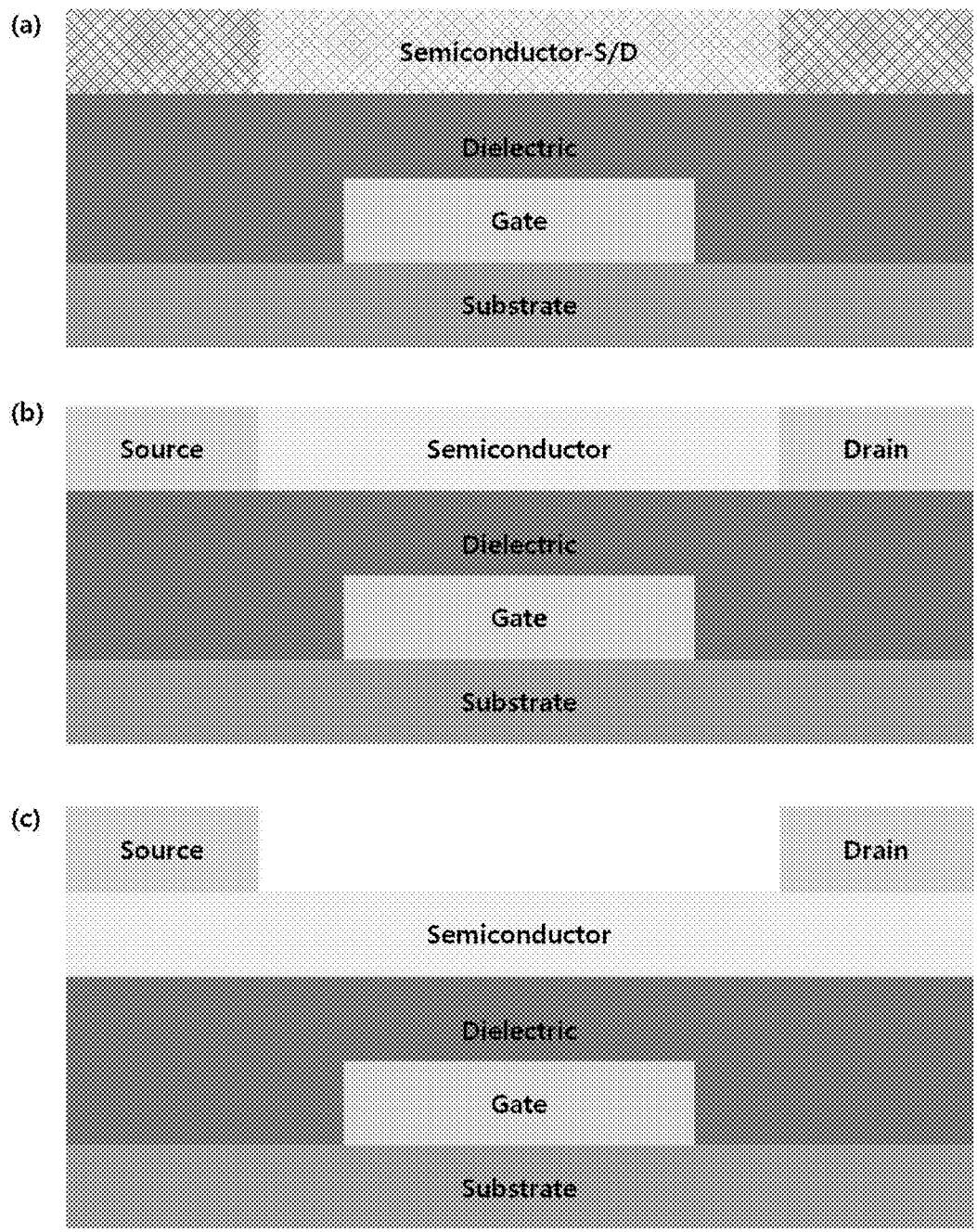
FIG. 1 illustrates the thin-film transistor in accordance with the present disclosure.

Hereinafter, embodiments of the present disclosure will be described in detail with reference to the accompanying drawings. The present disclosure may have various changes and may have various forms. Specific embodiments are illustrated in the drawings and described in detail therein. However, those embodiments are not intended to limit the present disclosure to any particular form thereof. It should be understood to include all changes, equivalents, or substitutes included in a spirit and scope in accordance with the present disclosure. In describing the drawings, similar reference numerals refer to similar components.

The terminology used herein is for the purpose of describing particular embodiments only and is not intended to be limiting the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A method for manufacturing a conductive polymer thin-film having a semiconductor property in accordance with the present disclosure includes treating at least a portion of the conductive polymer thin-film with a surface treatment agent.

Prior to the treatment step, the conductive polymer thin-film may be prepared by coating a conductive polymer dispersion on a substrate and then drying the conductive polymer dispersion applied on the substrate.

In this connection, the conductive polymer dispersion may be a dispersion in which a conjugate base coexists with a chain of an electrically conductive polymer with positive or negative charge to act as a complex thereto to achieve charge neutrality. For example, the conductive polymer having the + charge may be a polymer such as poly(3,4-ethylenedioxythiophene) (PEDOT) based polymer, polyaniline (PANI) based polymer, polydiimide based polymer, or the like. A dispersing solvent of the conductive polymer may include a solvent such as water, ethyl alcohol, propyl alcohol, butyl alcohol, acetone, ethylene glycol, DMSO, toluene, mesitylene, chloroform, chlorobenzene and the like.

Further, the conductive polymer dispersion may contain additives that may increase the electrical conductivity of the conductive polymer. For example, the additive may include organic solvents that may improve a morphology of the conductive polymer thin-film, organic or inorganic acids that can be used as secondary dopants, or surfactants that can change the morphology of the polymer thin-film and improve coating properties thereof. For example, the organic solvent may include ethylene glycol, dimethyl sulfoxide, methanol, etc. The organic or inorganic acid may include sulfuric acid, methane sulfonic acid, acetic acid, nitric acid, hydrochloric acid, etc. The surfactant may include a triton-based surfactant such as Triton X-100.

The method of applying the conductive polymer dispersion onto the substrate is not particularly limited as long as the method is capable of forming a conductive polymer thin-film on the substrate to a nanometer (nm) thickness. In this connection, a material of the substrate may be used without particular limitation thereto as long as a the material can withstand a thermal treatment temperature of the conductive polymer dispersion applied on the substrate.

In one example, the conductive polymer dispersion may be applied using spin coating onto the substrate. In this connection, the application of the conductive polymer dispersion may be executed for at least 30 seconds at a rotation speed of 500 rpm to 15000 rpm. When applying the conductive polymer dispersion at a rotational speed below 500 rpm, a thickness of the conductive polymer film may be so large that a bottom of the conductive polymer film may not be affected by the surface treatment agent. To the contrary, when applying the conductive polymer dispersion at a rotational speed above 15000 rpm, the thickness of the conductive polymer film may be so small that conductive polymer composites do not connect with each other.

Thermal treatment of the conductive polymer dispersion applied onto the substrate may be carried out under a desired condition under which the highest conductivity of the conductive polymer may be achieved. For example, when using PEDOT: PSS as a conductive polymer, the thermal treatment may be preferably performed for 1 to 240 minutes in a temperature range from room temperature to 200° C. where PEDOT: PSS may exhibit excellent conductivity.

The step of treating at least a portion of the conductive polymer thin-film with the surface treatment agent may be performed by exposing the conductive polymer thin-film to the surface treatment agent.

In accordance with the present disclosure, the surface treatment agent may refer to a material that may reduce a charge density in the conductive polymer chain. At least a portion of the conductive polymer thin-film as exposed to the surface treatment agent has reduced charge density.

For example, when the conductive polymer is a polymer with a positive charge, materials such as p-type dopant, n-type dopant, oxidizing agent and reducing agent may be used as the surface treatment agent. In one example, the surface treatment agent may include tetrakis(dimethylamino)ethylene (TDAE), ethylenediamine (EDA), hydrazine, sodium borohydride ($NaBH_4$), lithium aluminum hydride ($LiAlH_4$), sodium thiosulfate ($Na_2S_2O_3$), etc., or other compounds having a similar function thereto.

The conductive polymer thin-film may be treated entirely or locally with the surface treatment agent. That is, at least a portion of the conductive polymer thin-film may be treated with the surface treatment agent. In this connection, the at least a portion of the conductive polymer thin-film may be affected by the surface treatment agent, as well as a portion below the at least a portion of the conductive polymer thin-film may be affected by the surface treatment agent. For example, when a portion of the conductive polymer thin-film is treated with the surface treatment agent, the portion of the conductive polymer thin-film as treated with the surface treatment agent has a semiconductor property. A remaining portion of the conductive polymer thin-film that has not been treated with the surface treatment agent may have an electrically conductive property. In another example, when the entirety of the conductive polymer thin-film is treated with the surface treatment agent, the conductive polymer thin-film may have overall reduced charge density and may exhibit properties such as semiconductors.

The process of treating the conductive polymer thin-film with the surface treatment agent may be performed, for example, by immersing the conductive polymer thin-film in the surface treatment agent or coating the surface treatment agent on the surface of the conductive polymer thin-film. In this connection, the surface treatment time duration may be preferably 1 to 240 minutes. It may be desirable to remove the surface treatment agent from the conductive polymer thin-film or to dry the surface treatment agent after treating the conductive polymer thin-film with the surface treatment agent. In the above descriptions, for example, the method of exposing the conductive polymer thin-film to the surface treatment agent is mentioned, but the present disclosure is not limited thereto. As long as a method allows the conductive polymer thin-film in accordance with the present disclosure to contact the surface treatment agent, any method may be employed.

According to the present disclosure, treating the transparent conductive polymer thin-film in accordance with the present disclosure with the surface treatment agent may reduce the charge density of the treated conductive polymer thin-film. Therefore, the charge density of the conductive polymer thin-film may be controlled according to the present disclosure to form a conductive polymer thin-film having a semiconductor property and an electrically conductive property. Further, the conductive polymer thin-film having a semiconductor property and an electrically conductive property may be used as both of a semiconductor layer and a data electrode layer of a semiconductor-electrode integrated thin-film transistor.

The present thin-film transistor may include a substrate, a gate electrode, a gate dielectric layer, and the conductive polymer thin-film having semiconductor properties.

The thin-film transistor in accordance with the present disclosure may be a staggered type thin-film transistor having a TGBC (top-gate/bottom-contact) or BGTC (bottom-gate/top-contact) structure. Alternatively, the thin-film transistor in accordance with the present disclosure may be a coplanar type thin-film transistor having a TGTC (top-gate/top-contact) or BGBC (bottom-gate/bottom-contact) structure.

For example, when the thin-film transistor in accordance with the present disclosure is of a staggered type having a BGBC structure, the thin-film transistor in accordance with the present disclosure includes a substrate, a gate electrode disposed on the substrate, a gate dielectric layer covering the gate electrode, and the conductive polymer thin-film (layer) having semiconductor properties achieved via the reduced charge density, and disposed on the gate dielectric layer.

In accordance with the present disclosure, the substrate, gate electrode and gate dielectric layer (insulating layer) may be a general substrate, gate electrode or gate dielectric layer used in a general thin-film transistor. Therefore, detailed description thereof will be omitted.

Further, since the conductive polymer thin-film having the semiconductor property is substantially the same as that described with reference to the conductive polymer having the semiconductor property in accordance with the present disclosure. Thus, detailed description thereof will be omitted. With reference to FIG. 1, differences therebetween will be described.

FIG. 1 illustrates a thin-film transistor in accordance with the present disclosure.

(a) in FIG. 1 represents a thin-film transistor according to one embodiment of the present disclosure. (b) in FIG. 1 represents a thin-film transistor according to another embodiment of the present disclosure.

In FIG. 1, "Substrate" refers to a substrate, "Gate" refers to a gate electrode, "Dielectric" refers to a dielectric layer, "Semiconductor" refers to a semiconductor layer, "Source" refers to a source electrode, "Drain" refers to a drain electrode, and "Semiconductor-S/D" refers to a conductive polymer layer having the semiconductor property. Although a structure of the thin-film transistor in accordance with the present disclosure is illustrated in FIG. 1, the present disclosure is not limited thereto.

Referring to FIG. 1, in the thin-film transistor in accordance with the present disclosure, the conductive polymer thin-film having semiconductor properties may function as both of a semiconductor layer (active layer) and a data electrode (source and drain electrodes) of the thin-film transistor. That is, the thin-film transistor including the conductive polymer thin-film having a semiconductor property in accordance with the present disclosure may be a semiconductor-electrode integrated thin-film transistor (refer to (a) in FIG. 1). Specifically, as described in the above, a portion of the conductive polymer thin-film having the semiconductor property may be achieved by treating only the portion of the conductive polymer thin-film with the surface treatment agent, whereby the portion treated with the surface treatment agent reduces the charge density to have a semiconductor property. At the same time, a remaining portion of the conductive polymer thin-film as not treated with the surface treatment agent may exhibit good electrical conductivity. Therefore, the surface treated portion of the conductive polymer thin-film may serve as a semiconductor, while the remaining untreated portion of the conductive polymer thin-film may serve as an electrode layer. In this connection, for example, the conductive polymer thin-film having the semiconductor property may have a form in which a middle portion of the conductive polymer thin-film is treated with the surface treatment agent to reduce the charge density of the middle portion.

Alternatively, the thin-film transistor in accordance with the present disclosure may include a source electrode and a drain electrode along with a conductive polymer thin-film having the semiconductor property. In this connection, the source and drain electrodes may be spaced apart from each other and may contact the conductive polymer thin-film and may be disposed on the same layer as the conductive polymer thin-film having the semiconductor properties in accordance with the present disclosure. In this connection, for example, a portion of the conductive polymer thin-film having the semiconductor property may be achieved by treating only the portion of the conductive polymer thin-film with the surface treatment agent, whereby the portion treated with the surface treatment agent reduces the charge density to have a semiconductor property. At the same time, a remaining portion of the conductive polymer thin-film as not treated with the surface treatment agent may exhibit good electrical conductivity. Therefore, the surface treated portion of the conductive polymer thin-film may serve as a semiconductor, while the remaining untreated portion of the conductive polymer thin-film may serve as the source and drain electrodes spaced apart from one another. In this connection, the portion of the conductive polymer thin-film having the semiconductor property may define the same layer as the source and drain electrodes spaced apart from one another (see (b) in FIG. 1). Alternatively, the source and drain electrodes spaced apart from one another may be disposed on the portion of the conductive polymer thin-film having the semiconductor property (see (c) in FIG. 1). In this connection, the conductive polymer thin-film with the semiconductor properties may serve as a semiconductor layer of the thin-film transistor and at the same time may have ohmic contact with the source and drain electrodes, thereby to stabilize the performance of the thin-film transistor.

Since the thin-film transistor in accordance with the present disclosure includes the transparent conductive polymer thin-film having a semiconductor property, this may reduce the loss of light which may otherwise occur due to the gate line and the data line of the thin-film transistor, thereby exhibiting excellent transistor performance. Further, including the electrically conductive polymer thin-film having a semiconductor property that can simultaneously play both roles of a semiconductor layer and an electrode layer may allow the conductive polymer to act as an active layer (semiconductor layer) of a thin-film transistor, such that a low temperature process may be realized without damaging the plastic substrate, and excellent electrical conductivity may be secured without including a separate electrode. In one example, when the thin-film transistor in accordance with the present disclosure includes the source and drain electrodes separately, the polymer thin-film having the semiconductor property in accordance with the present disclosure acts as a semiconductor layer such that ohmic contact between the semiconductor layer and the source and drain electrodes may be achieved to stabilize the thin-film transistors for good performance thereof.

Hereinafter, according to a specific embodiment of the present disclosure, an electrically conductive polymer thin-film having a semiconductor property in accordance with the present disclosure, a method for manufacturing the same, and a thin-film transistor including the same will be described in detail.

First, to form a semiconductor-electrode integrated layer in accordance with the present disclosure, a PH1000 water dispersion of a conductive polymer poly(3,4-ethylenedioxythiophene): poly(styrene sulfonate) (PEDOT: PSS) and 1 to 10 vol % DMSO as a small amount of additive was mixed to prepare a PEDOT: PSS dispersion.

Next, the PEDOT: PSS dispersion was spin coted onto each substrate at a 3000 rpm for 60 seconds. Then, thermal treatment at 140° C. for 10 minutes was applied thereto to form a conductive polymer thin-film, PEDOT: PSS thin-film. In this connection, the substrates were a slide glass and a silicon wafer having an oxide film of 200 nm formed in a dried manner. Before coating the PEDOT: PSS dispersion on the substrate, each substrate was cleaned by ultrasonic treatment thereto in water, acetone, and isopropyl alcohol for 10 minutes, respectively, followed by plasma treatment.

Subsequently, the PEDOT: PSS thin-film formed on the substrate was surface-treated using ethylenediamine (EDA). Specifically, ethylenediamine was spin-coated on the PEDOT: PSS thin-film, which in turn was then thermally treated and dried to form a conductive polymer thin-film having a semiconductor property according to Present Example 1 in accordance with the present disclosure. This conductive polymer thin-film may be referred to as a surface-treated PEDOT: PSS thin-film. In this connection, thermal treatment was intended to dry ethylenediamine. Thus, the thermal treatment was carried out at a temperature above 116° C., a boiling point of ethylenediamine.

In order to evaluate a doping level change of the surface treated PEDOT: PSS thin-film as prepared according to Present Example 1 in accordance with the present disclosure, an ultraviolet/visible/near-infrared spectroscopy method was used. Ultraviolet/visible/near-infrared rays absorbances of the PEDOT: PSS thin-film not subjected to the surface treatment formed on the slide glass substrate and the PEDOT: PSS thin-film as surface treated according to Present Example 1 in accordance with the present disclosure were measured. The result is shown in FIG. 2.

Figure 2:
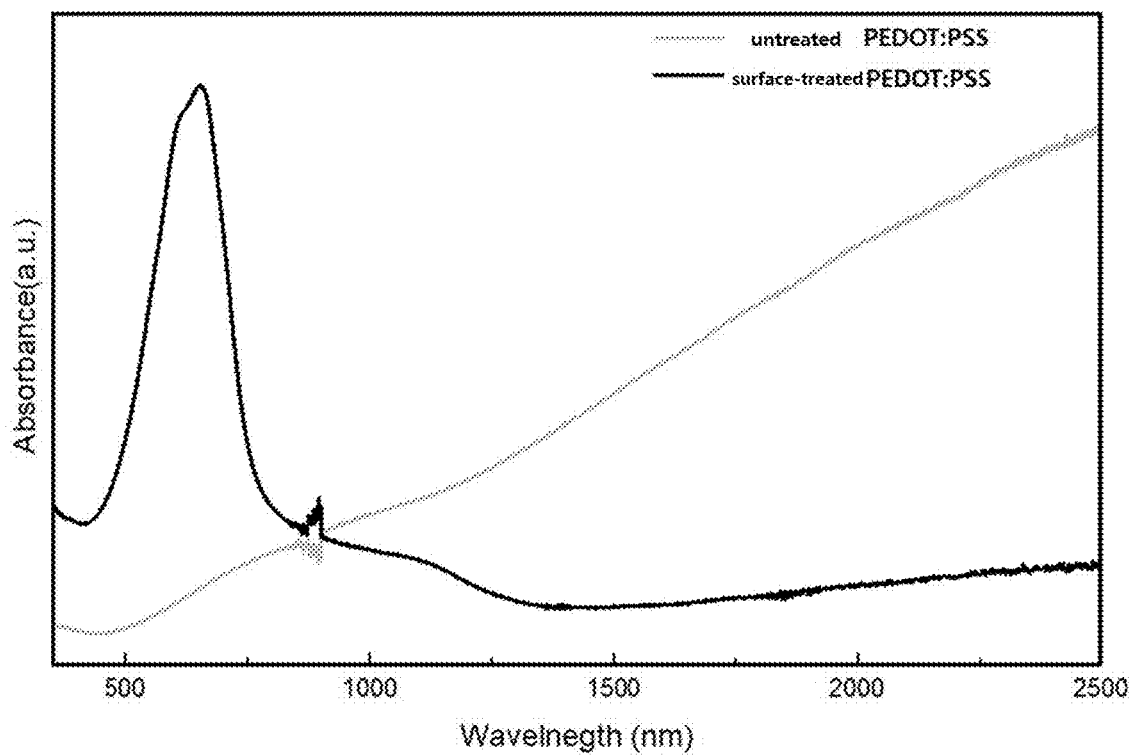
FIG. 2 is a diagram for describing ultraviolet, visible, near-infrared rays absorbances of a conductive polymer thin-film having a semiconductor property according to an embodiment of the present disclosure.

FIG. 2 is a diagram for describing ultraviolet/visible/near-infrared rays absorbances of a conductive polymer thin-film having a semiconductor property according to an embodiment of the present disclosure.

Referring to FIG. 2, it is confirmed that the untreated PEDOT: PSS has 3 absorbing bands in the absorption spectrum, specifically, a neutral polymer absorbing band around 600 nm, a polaron absorbing band around 1000 nm, and a bipolaron absorbing band beyond 1500 nm based on the doping level, as shown in the previously reported absorbance graph of PEDOT: PSS.

To the contrary, the surface treated PEDOT: PSS thin-film according to Present Example 1 in accordance with the present disclosure may exhibit strong absorption in a short wavelength band. That is, in the surface treated PEDOT: PSS thin-film, the neutral polymer absorbing band is dominant.

In the spectroscopic method, the comparison based on the doping level is based on a fact that a conductive polymer doped by conjugate ions has an absorption wavelength band varying depending on the charge type. Amounts of + positive charges of neutral polymers, polaron and bipolaron may vary based on the absorption wavelength bands. Thus, the comparisons of the absorption intensities may lead to comparisons of charge amounts in the polymer. In this connection, as the absorption intensity of the polaron and bipolaron is dominant, this may mean a high doping level. To the contrary, as the absorption intensity of the neutral polymer is dominant, this means a low doping level.

That is, before the conductive polymer thin-film is treated with the surface treatment agent that lowers the charge density, a sufficient amount of charge exists in the conductive polymer chain. Thus, the 900 nm-around absorbing band corresponding to the polar and the absorbing band beyond 1400 nm corresponding to bipolaron are predominant. According to the present disclosure, after the conductive polymer thin-film is treated with the surface treatment agent, it may be seen that the absorbing band around the 600 nm corresponding to the neutral polymer may be dominant. This indicates that the surface treated PEDOT: PSS thin-film has a low doping level according to the present disclosure.

Therefore, it may be confirmed that the charge density of the electrically conductive thin-film is reduced in accordance with the present disclosure. Accordingly, it may be confirmed that an electrically conductive thin-film having a semiconductor property may be manufactured according to the present disclosure.

Subsequently, to evaluate the functions of the surface treated PEDOT: PSS thin-film according to Present Example 1 in accordance with the present disclosure as both of the semiconductor layer and the electrode layer in the organic thin-film transistor, an organic thin film transistor (OTFT) having a BGTC structure including a surface treated PEDOT: PSS thin-film according to Present Example 1 in accordance with the present disclosure was prepared. Driving results of the transistor were verified using a precision semiconductor parameter analyzer. A maximum current value that could be detected by the precision semiconductor parameter analyzer was 10 mA. The transistor driving results are shown in FIG. 3.

Figure 3:
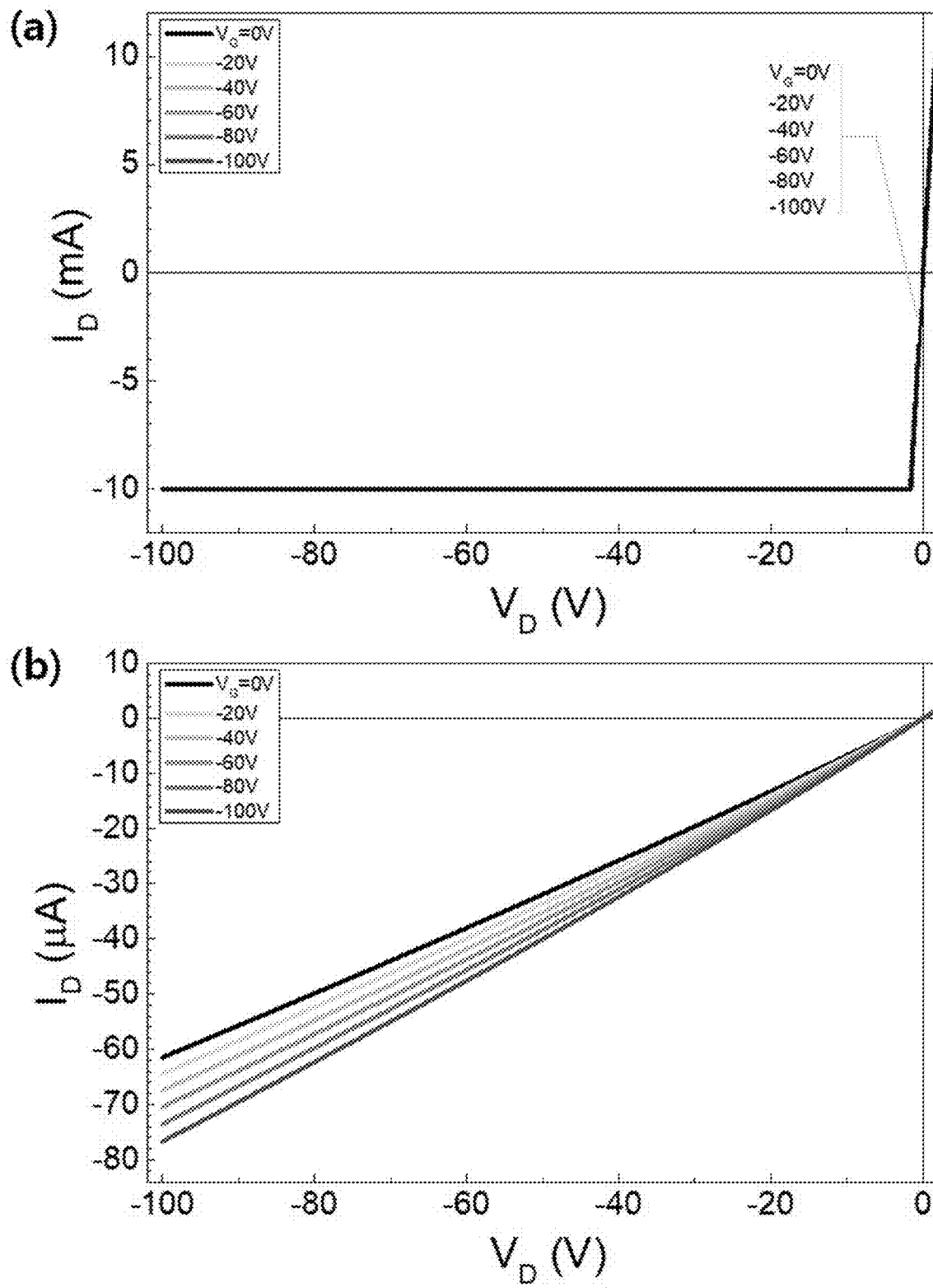
FIG. 3 is a diagram for describing a thin-film transistor including a conductive polymer thin-film having a semiconductor property according to an embodiment of the present disclosure.

FIG. 3 is a diagram for describing a thin-film transistor including a conductive polymer thin-film having a semiconductor property according to an embodiment of the present disclosure.

In FIG. 3, (a) shows a result of the OTFT including the untreated PEDOT: PSS thin-film. (b) shows a result of the OTFT including the EDA based surface-treated PEDOT: PSS thin-film according to one embodiment of the present disclosure.

Referring to FIG. 3, the organic thin-film transistor containing the PEDOT: PSS thin-film not subjected to the surface treatment may reach −10 mA at a voltage of −1.6 V due to the high electrical conductivity of the PEDOT: PSS thin-film not subjected to surface treatment.

To the contrary, according to Present Example 1 in accordance with the present disclosure, the organic thin-film transistor including an EDA based surface treated PEDOT: PSS thin-film may have a low current at microamperes $\mu A$. This means that the charge density, that is, the electrical conductivity of the PEDOT: PSS thin-film is reduced due to the surface treatment.

That is, it may be confirmed that the surface treated PEDOT: PSS thin-film according to the present disclosure may serve as a semiconductor layer and an electrode layer in the thin-film transistor. Further, it may be seen that controlling the charge density of the conductive polymer thin-film may adjust the current value of the thin-film transistor based on the gate voltage of the thin-film transistor.

Thus, as confirmed with reference to FIG. 2 and FIG. 3 as descried above, the charge density is easily controlled using a process of treating the surface of the conductive polymer thin-film with the surface treatment agent according to the present disclosure. Thus, a transparent conductive polymer thin-film that may exhibit semiconductor properties may be obtained. Further, it may be seen that the semiconductor-electrode integrated thin-film transistor may be realized using the conductive polymer thin-film that may exhibit the semiconductor property in accordance with the present disclosure.

Although the above description has been described with reference to the preferred embodiments of the present disclosure, those skilled in the art have various modifications thereto without departing from the spirit and scope in accordance with the present disclosure as set forth in the claims below.

What is claimed is:

1. A method for manufacturing a transparent conductive polymer thin-film having a semiconductor property, the method comprising:
    exposing a portion of a transparent conductive polymer thin-film to a surface treatment agent to reduce a charge density of the exposed at least a portion of the conductive polymer thin-film,
    wherein the surface treatment agent includes at least one of tetrakis(dimethylamino)ethylene (TDAE), ethylenediamine (EDA), hydrazine, sodium borohydride ($NaBH_4$), lithium aluminum hydride ($LiAlH_4$), or sodium thiosulfate ($Na_2S_2O_3$),
    wherein the portion of the conductive polymer thin-film treated with the surface treatment agent is transparent and has a semiconductor property and a remaining portion of the conductive polymer thin-film that has not been treated with the surface treatment agent is transparent and has an electrically conductive property, and
    wherein the exposing comprises forming a semiconductor layer of a semiconductor-electrode integrated thin-film transistor, wherein the remaining portion comprises a data electrode layer of the semiconductor-electrode integrated thin-film transistor.

2. The method of claim 1, wherein the conductive polymer includes at least one of poly(3,4-ethylenedioxythiophene) (PEDOT) based polymer, polyaniline (PAM) based polymer, or polydiimide based polymer.

3. The method of claim 1, wherein the conductive polymer thin-film, prior to being exposed to the surface treatment agent, is prepared by:
    applying a conductive polymer dispersion onto a substrate; and
    drying the conductive polymer dispersion applied on the substrate.

* * * * *